United States Patent [19]

Williams et al.

[11] Patent Number: 4,846,725

[45] Date of Patent: Jul. 11, 1989

[54] SELF-LATCHING POWER LINE CLAMP

[75] Inventors: Danny R. Williams; Ronald J. Finke, both of Houston, Tex.

[73] Assignee: Houston Industries Incorporated, Houston, Tex.

[21] Appl. No.: 181,840

[22] Filed: Apr. 15, 1988

[51] Int. Cl.[4] .............................................. H01R 4/38
[52] U.S. Cl. .................... 439/479; 439/803; 24/135 R
[58] Field of Search ...................... 439/100, 477–479, 439/803, 480; 24/135 R, 135 N; 174/845, 945

[56] References Cited

U.S. PATENT DOCUMENTS

| | | |
|---|---|---|
| 1,546,839 | 7/1925 | Klingel . |
| 2,151,524 | 3/1939 | Pittman et al. . |
| 2,206,653 | 7/1940 | Yonkers . |
| 2,304,807 | 12/1942 | Donoghue . |
| 2,453,761 | 11/1948 | Schoonmaker . |
| 2,508,778 | 5/1950 | Spears . |
| 2,811,703 | 10/1957 | Becker . |
| 2,864,071 | 12/1958 | Johnson . |
| 2,867,787 | 1/1959 | Nilsson . |
| 2,958,067 | 10/1960 | Hardy . |
| 3,036,286 | 5/1962 | Gorc et al. . |
| 3,057,232 | 10/1962 | Cornell, Jr. . |
| 3,075,166 | 1/1963 | Peek . |
| 3,097,037 | 7/1963 | Gainer et al. . |
| 3,288,409 | 11/1966 | Bethea, Jr. . |

OTHER PUBLICATIONS

W. H. Salisbury & Co., "Protective Grounding Equipment" 1985, Feb.

Primary Examiner—Gary F. Paumen
Attorney, Agent, or Firm—Pravel, Gambrell, Hewitt, Kimball & Krieger

[57] ABSTRACT

A clamp is provided for grounding electrical power lines and the like. The clamp automatically latches itself into a firm gripping relationship with the electrical power line when brought into contact with the power line.

21 Claims, 2 Drawing Sheets

SELF-LATCHING POWER LINE CLAMP

BACKGROUND OF INVENTION

1. Field of Invention

The present invention relates to self-latching clamps for power lines and the like.

2. Description of the Prior Art

There are a number of situations when it has been necessary to connect protective grounding equipment to electrical power distribution lines. The grounding equipment was mounted at an end of an elongate insulative rod, known in the industry as a "hot stick", and raised for connection onto the power line. Typically, the grounding equipment had a stirrup or notch which was placed over the power line. The grounding equipment also included a rotatable threaded rod or bolt having an eyelet at a lower end and a gripping jaw at an upper end. The bolt and eyelet were rigidly held in a hollow upper portion of the hot stick as the grounding equipment was raised to the power line and the stirrup placed on the power line. The bolt and eyelet were then released from the hot stick so that a hook at an upper end of the hot stick could engage the eyelet. This engagement was by nature a relatively loose one. The hot stick could then be rotated by the line crew, moving the bolt inwardly, as long as the hook engagement with the eyelet was maintained. Rotation was continued until the gripping jaw firmly held the power line in place in the stirrup.

So long as the power line was in a substantially horizontal plane and the line crew on the ground below, these apparatus were generally adequate. There were several situations, however, where problems were presented. For example, there are a number of types of electrical power distribution equipment from which the power lines extend in directions other than horizontally. Examples are breakers and transformers where it was not unusual to have the power line at angles of 45° or more from the horizontal. With these and other equipment, a power line could also be nearly vertical.

With power lines in non-horizontal planes, the grounding equipment due to its own weight tended to slide down the power line or fall off the line. It was also a difficult task to rotate the threaded rod which was only loosely engaged at its eyelet with the hook on the hot stick. Another problem situation occurred with the line crew member was on a support pole working on a generally horizontal line at about the same elevation. Again, manipulation and rotation of the threaded rod was a cumbersome and awkward task.

SUMMARY OF INVENTION

Briefly, the present invention provides a new and improved clamp for connection to an electrical power line. The clamp of the present invention includes a stirrup for fitting onto the electrical power line and a movable gripping jaw for gripping the electrical power line in the stirrup. A releasable spring is provided with the clamp for forcing the gripping jaw into contact with the electrical power line. The movable gripping jaw is mounted in a housing body along with the stirrup and held in a retracted position with the releasable spring compressed before the clamp is connected to the electrical power line. When the stirrup is fitted onto the electrical power line, a contact in the clamp adjacent the stirrup is also contacted by the power line, releasing compression on the releasable spring, which then forces the gripping jaw into contact with the power line. The clamp of the present invention is then firmly gripping the power line between the gripping jaw and the sitrrup under the force of the releasable spring. The powe line can the be locked firmly onto the power line by a locking mechanism mounted with the housing body.

The gripping jaws and stirrup of the present invention also have contact surfaces which conform generally to an outer surface of the power line and extend longitudinally substantially axially with a central longitudinal axis of the power line. The locking mechanism, however, is movably mounted with respect to the housing body along an axis which extends at an acute angle, usually from about 20° to about 50°, from the longitudinal axis of the power line. This feature of the clamp of the present invention eases problems of line crew members working on non-horizontal lines and in other problem situations.

DESCRIPTION OF PREFERRED EMBODIMENT

Figure 2:
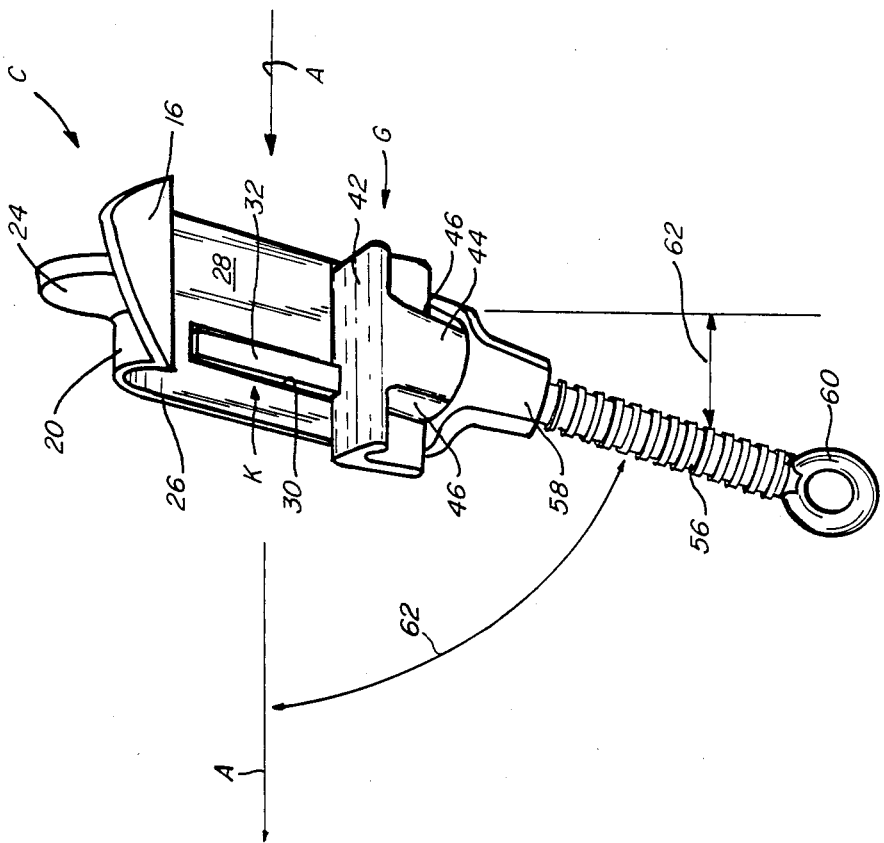
FIG. 2 is an isometric view of a clamp according to the present invention.

In the drawings, the letter C designates generally a self-latching clamp for latching to an electrical power line P during the connection of protective grounding equipment to the power line P. The clamp C includes a stirrup member S formed at an upper end of a housing body H and a gripping jaw G mounted at an opposite end of the housing body H from the stirrup S. As is conventional, the housing body H has ferrule mounting structure including an upper ferrule mounting sleeve 10 having an internal passage for an upper end of a conventional ferrule (not shown) mounted at an upper end of a grounding cable and one or more clamp sleeves 12 for passage therethrough of conventional cable clamps. The housing body H further includes a socket 14 for receiving a manipulating hook at an upper end of a conventional insulating manipulation arm, or a "hot stick" as is commonly referred to in the power industry.

The stirrup S has a front contact or guide plate 16 formed extending outwardly from the housing body H at a slight upward angle. The guide plate 16 is adapted to be brought into contact with an outer surface 18 of the power line P and slide therealong. A generally semicircular sleeve or channel member 20 is formed inwardly on the stirrup S from the guide plate 16. The sleeve member 20 extends laterally a suitable distance (FIG. 2) to insure adequate electrical contact with the power line P. The sleeve member 20 also has an arcuate inner contact surface 22 conforming generally to the outer surface 18 of the power line P. The inner contact surface 22 also extends generally longitudinally coaxially with a central longitudinal axis, as indicated by an arrow A (FIGS. 2-3) of the power line P. As has been set forth above, the axis A may extend at any of a number of angles from a horizontal plane with respect to the earth's surface. In some instances, as detailed above, such an axis may be at or near vertical. The stirrup member S preferably also includes one or more stiffener ribs 24 for strength purposes.

The housing body member H includes a central body portion 26 extending away from the stirrrup member S having a generally flat rear wall 28. A socket or slot 30 is formed in the rear wall 28 of the housing body H for receiving a depressible contact K therein. The depressible contact K is preferably a depressible leaf spring 32 mounted at an upper end 34 on a transversely extending pin 36 in the socket 30. The leaf spring 32 has an inwardly extending contact lip 37 and a locking lug 38 formed at a lower end thereof. The locking lug 38 engages a rim 40 of rear wall 28 of housing body H adjacent the opening 30, retaining the contact spring K in the housing body H when contact K is not depressed.

The gripping jaw G includes an arcuate upper contact surface 42 conforming generally to the outer surface 18 of the power line P and extending, as was the case with the sleeve 20, longitudinally a suitable distance substantially coaxially with the central longitudinal axis A of the power line P. An inner lip 43 is formed along surface 42 for engagement with the contact lip 37°, for reasons to be set forth. The gripping jaw G further includes a head member 44 beneath the upper contact surface 42 and outer supports or shoulders 46 formed extending outwardly from head member 44 beneath the shoulders 46. A socket or passage 48 is formed in each of the shoulders 46 for receipt therein of a connector pin 50 mounted at an upper end of a connector rod 52. The connector rod 52 connects the gripping jaw G to a compressible, releasable spring R mounted in an inner passage 54 of a threaded locking bolt L. In the position shown in FIG. 1, the releasable spring R is in its most fully compressed position.

The threaded locking bolt L has a threaded external surface 56 which mates with a corresponding threaded internal passage (not shown) formed internally of a sleeve member 58 formed at a second or lower end of the housing body H. The threaded locking bolt L is rotatably movable in the threaded internal passage in the sleeve 58 to selectively engage and disengage with the gripping jaw G, as will be set forth below. The locking bolt L further includes a connector eyelet 60 mounted at a lower end thereof. The eyelet 60 is adapted to receive a hook at an upper end of a connector stick or "hot stick" operated by a power line crew member.

It has been noted above that the contact surface 22 of stirrup S and contact surface 42 of gripping jaw G extend substantially coaxially with the longitudinal axis A of the power line P. However, in contrast with the prior art, the longitudinal axis of the locking bolt L of the present invention extends at an acute angle (indicated by an arrow 62) from that of the axis A of the power line P. The angle 62 may be from about 20° to 50° from that of the axis A. One found suitable is about 30°. With this structural feature of the present invention, and with the releasable spring R, the clamp C can be easily and firmly engaged with the power line P, regardless of the orientation of its axis A with respect to the horizontal plane.

Figure 1:
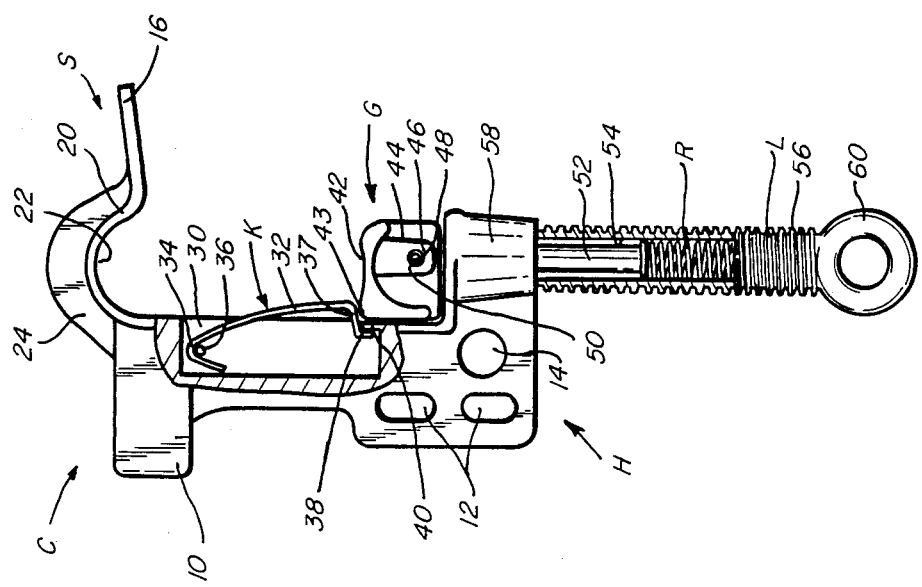
FIG. 1 is an elevation view, taken partly in cross section, of a clamp according to the present invention.

In the operation of the present invention, conventional grounding ferrules and connector clamps are used to attach the clamp C at the mounting ferrule 10 and clamp sleeves 12 to the grounding cable. The locking bolt L is then initially threaded downwardly to a lowermost position (FIG. 1) so that the gripping jaw G may be moved downwardly, compressing the releasable spring R within the passage 54. The gripping jaw G is then moved downwardly to the position shown in FIG. 1 so that the contact K moves outwardly, with the contact surface 37 of contact K engaging the inner lip 43 of the upper surface 42 of the gripping jaw G, holding the gripping jaw G in the depressed position (FIGS. 1 and 2). With the clamp C in this position, it is available for use in grounding the electrical power line P.

Figure 4:
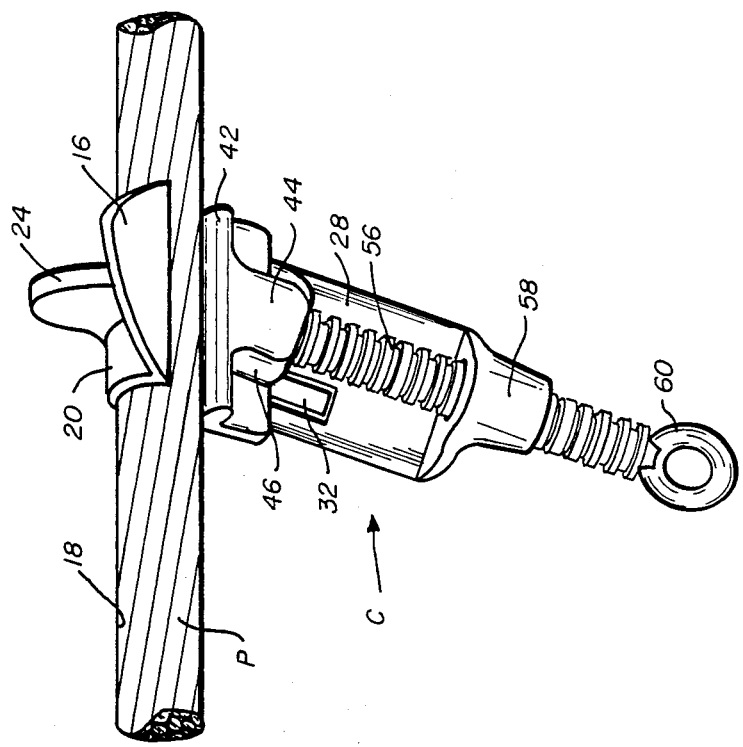
FIGS. 3 and 4 are isometric views of the clamp of FIGS. 1 and 2 being connected to an electrical power line.
Figure 3:
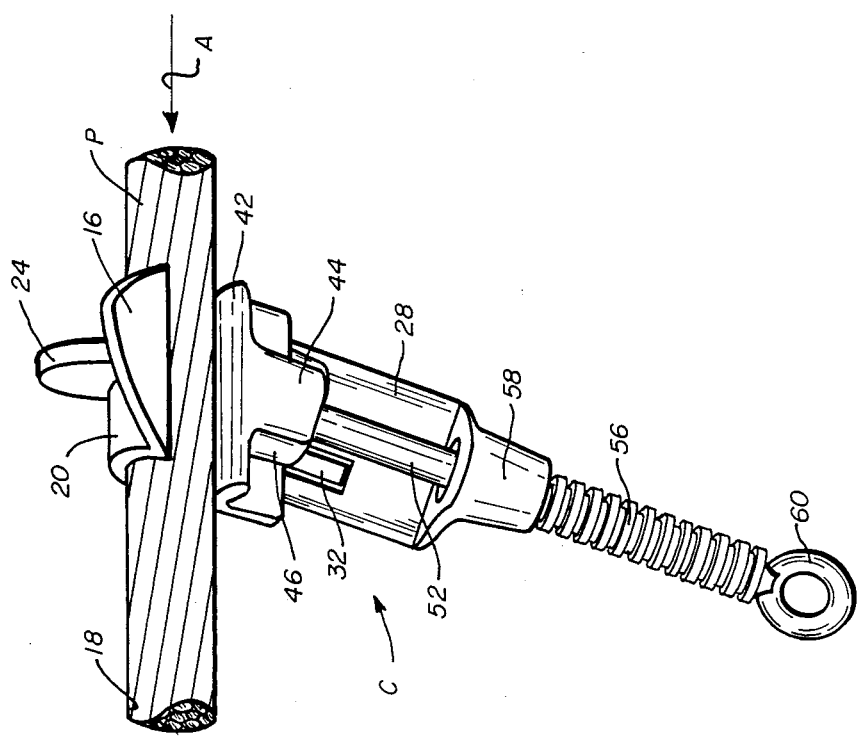

In order to do so, the clamp C is inserted in an upper end of a conventional hot stick and connected by the eyelet 60 to a hook in an upper end of such hot stick. The clamp C then may be manipulated by a power line crew member so that the guide plate 16 slides across the outer surface 18 of the power line P until the power line P fits within the sleeve member 20. As the power line P moves into position in the sleeve member 20, the contact spring K is depressed into the socket 30, permitting the releasable spring R, through the connector rod 52, to urge the gripping jaw G towards, and into contact with, the power line P (FIG. 3). The gripping jaw G is then in a position firmly gripping the power line P between the contact surface 42 of the gripping jaw G and the contact surface 22 of the sleeve 20 of the stirrup S. In this position, the force exerted by the releasable spring R is sufficient to hold the clamp C firmly in place on the power line P regardless of whether the longitudinal axis A of the power line P is in the horizontal plane, the vertical plane or otherwise. The power line crew member may then begin rotation, by means of the connection between eyelet 60 and the hot stick, of the threaded locking bolt L. This rotation serves to move the locking bolt L upwardly through the sleeve 58 of the housing body H until the threaded locking bolt α is firmly in contact with the gripping jaw G (FIG. 4), firmly locking the gripping jaw G, and consequently the clamp C, onto the power line P.

In order to disconnect the clamp C, the eyelet 60 is again engaged by a hook of the hot stick. Rotation of the locking bolt L is then reversed, retracting the locking bolt L until it is in a retracted position (FIG. 1). The force exerted by spring R on gripping jaws G can then be overcome by adequate force on the clamp C through eyelet 60 by the line crew member using the hot stick.

The foregoing disclosure and description of the invention are illustrative and explanatory thereof, and various changes in the size, shape and materials, as well as in the details of the illustrated construction may be made without departing from the spirit of the invention.

We claim:

1. A clamp for connection to an electrical power line, comprising:
   (a) stirrup means for fitting onto the electrical power line;
   (b) movable gripping jaw means for gripping the electrical power line in said stirrup means;
   (c) releasable spring means for forcing said gripping jaw means into contact with the electrical power line; and
   (d) contact means adjacent said stirrup means for releasing said releasable spring means when contacted by the power line, said releasing occurring without any further manipulation of the clamp by an operator.

2. The clamp of claim 1, further including:
   locking means for locking said gripping jaw means in contact with the electrical power line.

3. The clamp of claim 1, further including:
   a housing body having said stirrup means mounted at a first end thereof and said gripping jaw means mounted at a second end thereof.

4. The clamp of claim 3, wherein:
said contact means is mounted on said housing body between said stirrup means and said gripping jaw means.

5. The clamp of claim 3, further including:
locking means mounted with said housing body for locking said gripping jaw means in contact with the electrical power line.

6. The clamp of claim 5, wherein said locking means comprises:
a locking bolt for selectively engaging said gripping jaw means.

7. The clamp of claim 6, further including:
a connector eyelet mounted on said locking bolt for receiving an end of a connector stick operated by a power line crew member.

8. The clamp of claim 6, wherein:
said locking bolt has a threaded external surface; and
said housing body has a threaded internal passage formed in said second end thereof; and
said locking bolt is rotatably movable in said threaded internal passage to engage and disengage with said gripping jaw means.

9. The clamp of claim 5, further including:
a connecting rod movable with respect to said housing body for connecting said gripping jaw means and said releasable spring means.

10. The clamp of claim 9, wherein:
said releasable spring means is mounted within said locking means.

11. The clamp of claim 9, wherein:
said connecting rod and said gripping jaw means are movable with respect to said housing body to compress said releasable spring means.

12. The clamp of claim 11, wherein said contact means includes:
means for blocking relative movement of said connecting rod and said gripping jaw means when said releasable spring means is compressed.

13. The clamp of claim 3, further including:
an electrical connector eyelet formed on said housing body for receiving an electrical grounding wire.

14. The clamp of claim 1, including said stirrup means and said gripping jaw means having contact surfaces conforming to an outer surface of the electrical power line.

15. The clamp of claim 14, including said contact surfaces extending longitudinally substantially coaxially with a central longitudinal axis of the electrical power line.

16. The clamp of claim 15, further including:
a housing body for receiving said stirrup means at a first end thereof and said gripping jaw means at a second end thereof.

17. The clamp of claim 16, further including:
locking means movably mounted with said housing body for locking said gripping jaw means in contact with the electrical power line.

18. The clamp of claim 17, wherein:
said locking means is movably mounted with respect to said housing body along a longitudinal axis extending at an acute angle from the longitudinal axis of the electrical power line.

19. The clamp of claim 17, wherein:
said locking means is movably mounted with respect to said housing body along a longitudinal axis extending at an angle of between about 20° to about 50° from the longitudinal axis of the electrical power line.

20. A clamp for connecting to an electrical power line, comprising:
(a) stirrup means for fitting onto the electrical power line;
(b) movable gripping jaw means for gripping the electrical power line in said stirrup means;
(c) a housing body having said stirrup means mounted at a first end thereof and said gripping jaw means mounted at a second end thereof;
(d) said stirrup means and said gripping jaw means having contact surfaces conforming to an outer surface of the electrical power line;
(e) said contact surfaces extending longitudinally substantially coaxially with a central longitudinal axis of the electrical power line;
(f) locking means movably mounted with said housing body for locking said gripping jaw means in contact with the electrical power line;
(g) said locking means being movably mounted with respect to said housing body along a longitudinal axis extending at an acute angle from the longitudinal axis of the electrical power line;
(h) releasable spring means for forcing said gripping jaw means into contact with the electrical power line; and
(i) contact means adjacent said stirrup means for releasing said releasable spring means when contacted by the power line, said releasing occurring without any further manipulation of the clamp by an operator.

21. The clamp of claim 20, wherein:
said locking means is movably mounted with respect to said housing body along a longitudinal axis extending at an angle of between about 20° to about 50° from the longitudinal axis of the electrical power line.

* * * * *